(12) United States Patent
Greene et al.

(10) Patent No.: US 10,629,699 B2
(45) Date of Patent: Apr. 21, 2020

(54) GATE HEIGHT CONTROL AND ILD PROTECTION

(71) Applicant: International Business Machines Corporation, Armonk, NY (US)

(72) Inventors: Andrew M. Greene, Albany, NY (US); John R. Sporre, Albany, NY (US); Stan Tsai, Clifton Park, NY (US); Ruilong Xie, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/841,942

(22) Filed: Dec. 14, 2017

(65) Prior Publication Data
US 2018/0219081 A1 Aug. 2, 2018

Related U.S. Application Data

(63) Continuation of application No. 15/422,742, filed on Feb. 2, 2017, now Pat. No. 9,923,080.

(51) Int. Cl.
| | |
|---|---|
| *H01L 27/088* | (2006.01) |
| *H01L 29/66* | (2006.01) |
| *H01L 29/78* | (2006.01) |
| *H01L 21/3105* | (2006.01) |
| *H01L 21/8234* | (2006.01) |
| *H01L 29/06* | (2006.01) |

(Continued)

(52) U.S. Cl.
CPC .. *H01L 29/66545* (2013.01); *H01L 21/31055* (2013.01); *H01L 21/823431* (2013.01); *H01L 27/0886* (2013.01); *H01L 29/0653* (2013.01); *H01L 29/401* (2013.01); *H01L 29/42376* (2013.01); *H01L 29/66795* (2013.01); *H01L 29/785* (2013.01); *H01L 21/31144* (2013.01)

(58) Field of Classification Search
USPC .......... 257/348, 376, 392, 4, 401, 288, 901; 438/292–308
See application file for complete search history.

(56) References Cited

U.S. PATENT DOCUMENTS

| | | | |
|---|---|---|---|
| 9,059,164 B2* | 6/2015 | Cheng | H01L 29/511 |
| 9,425,103 B2 | 8/2016 | Xie et al. | |

(Continued)

OTHER PUBLICATIONS

List of IBM Patents or Patent Applications Treated as Related, U.S. Appl. No. 15/841,942, filed Dec. 14, 2017, 2 Pages.

(Continued)

*Primary Examiner* — Niki H Nguyen
(74) *Attorney, Agent, or Firm* — Cantor Colburn LLP; Joseph Petrokaitis

(57) ABSTRACT

Embodiments are directed to methods of forming a semiconductor device and resulting structures for improving gate height control and providing interlayer dielectric (ILD) protection during replacement metal gate (RMG) processes. The method includes forming a semiconductor fin on a substrate. A sacrificial gate is formed over a channel region of the semiconductor fin, and an oxide hard mask is formed on a surface of the sacrificial gate. An interlayer dielectric (ILD) is formed adjacent to the sacrificial gate. The ILD is recessed below a surface of the oxide hard mask, and a nitride layer is formed on a surface of the recessed ILD.

20 Claims, 12 Drawing Sheets

(51) Int. Cl.
    *H01L 29/40*     (2006.01)
    *H01L 29/423*     (2006.01)
    *H01L 21/311*     (2006.01)

(56) References Cited

U.S. PATENT DOCUMENTS

| | | |
|---|---|---|
| 9,818,841 B2 | 11/2017 | Chang et al. |
| 10,008,574 B2 | 6/2018 | Hsieh et al. |
| 10,249,501 B2 * | 4/2019 | Adusumilli ......... H01L 29/4966 |
| 2016/0211251 A1 * | 7/2016 | Liaw .................. H01L 27/0207 |

OTHER PUBLICATIONS

Andrew M. Greene, et al. "Gate Height Control and ILD Protection," U.S. Appl. No. 15/422,742, filed Feb. 2, 2017.

* cited by examiner

GATE HEIGHT CONTROL AND ILD PROTECTION

DOMESTIC AND/OR FOREIGN PRIORITY

This application is a continuation of U.S. application Ser. No. 15/422,742, titled "GATE HEIGHT CONTROL AND ILD PROTECTION" filed Feb. 2, 2017, the contents of which are incorporated by reference herein in its entirety.

BACKGROUND

The present invention relates in general to semiconductor device fabrication methods and resulting structures. More specifically, the present invention relates to fabrication methods and resulting structures that improve gate height control and provide interlayer dielectric (ILD) protection during replacement metal gate (RMG) processes.

In contemporary semiconductor device fabrication processes a large number of semiconductor devices such as field effect transistors (FETs) and on-chip capacitors are fabricated on a single wafer. Some non-planar device architectures, such as fin-type field effect transistors (finFETs), employ semiconductor fins and side-gates that can be contacted outside the active region, resulting in increased device density and some increased performance over lateral devices. A typical finFET device includes a vertical fin or nanowire that extends upward from the substrate. The fin or nanowire forms the channel region of the transistor. A source region and a drain region are situated in electrical contact with the top and bottom ends of the channel region, and the gate is disposed on one or more of the fin or nanowire sidewalls.

SUMMARY

According to one or more embodiments of the present invention, a method of fabricating a semiconductor device that improves gate height control and provides interlayer dielectric (ILD) protection during replacement metal gate (RMG) processes is provided. The method includes forming a semiconductor fin on a substrate. A sacrificial gate is formed over a channel region of the semiconductor fin and an oxide hard mask on a surface of the sacrificial gate. An interlayer dielectric (ILD) is formed adjacent to the sacrificial gate. The ILD is recessed below a surface of the oxide hard mask, and a nitride layer is formed on a surface of the recessed ILD.

According to one or more embodiments of the present invention, a method of fabricating a semiconductor device that improves gate height control and provides ILD protection during RMG processes is provided. The method includes forming a semiconductor fin on a substrate. A shallow trench isolation (STI) region is formed on the substrate and adjacent to the semiconductor fin. A first plurality of adjacent sacrificial gates is formed over channel regions of the semiconductor fin and a second plurality of adjacent sacrificial gates over the STI region. An oxide hard mask is formed on a surface of each of the sacrificial gates. An ILD is formed between each pair of adjacent sacrificial gates, and the ILD is recessed below a surface of the oxide hard masks. A nitride layer is formed on a surface of the recessed ILD.

According to one or more embodiments of the present invention, a semiconductor device having improved gate height control and a protected ILD. The device includes a semiconductor fin formed on a substrate, along with a conductive gate formed over a channel region of the semiconductor fin. A first spacer is formed on the semiconductor fin and adjacent to a first sidewall of the conductive gate. A second spacer is formed on the semiconductor fin and adjacent to a second sidewall of the conductive gate. An ILD is formed adjacent to the first and second spacers. The ILD is recessed below a surface of the conductive gate, and a nitride layer is formed on a surface of the recessed ILD.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
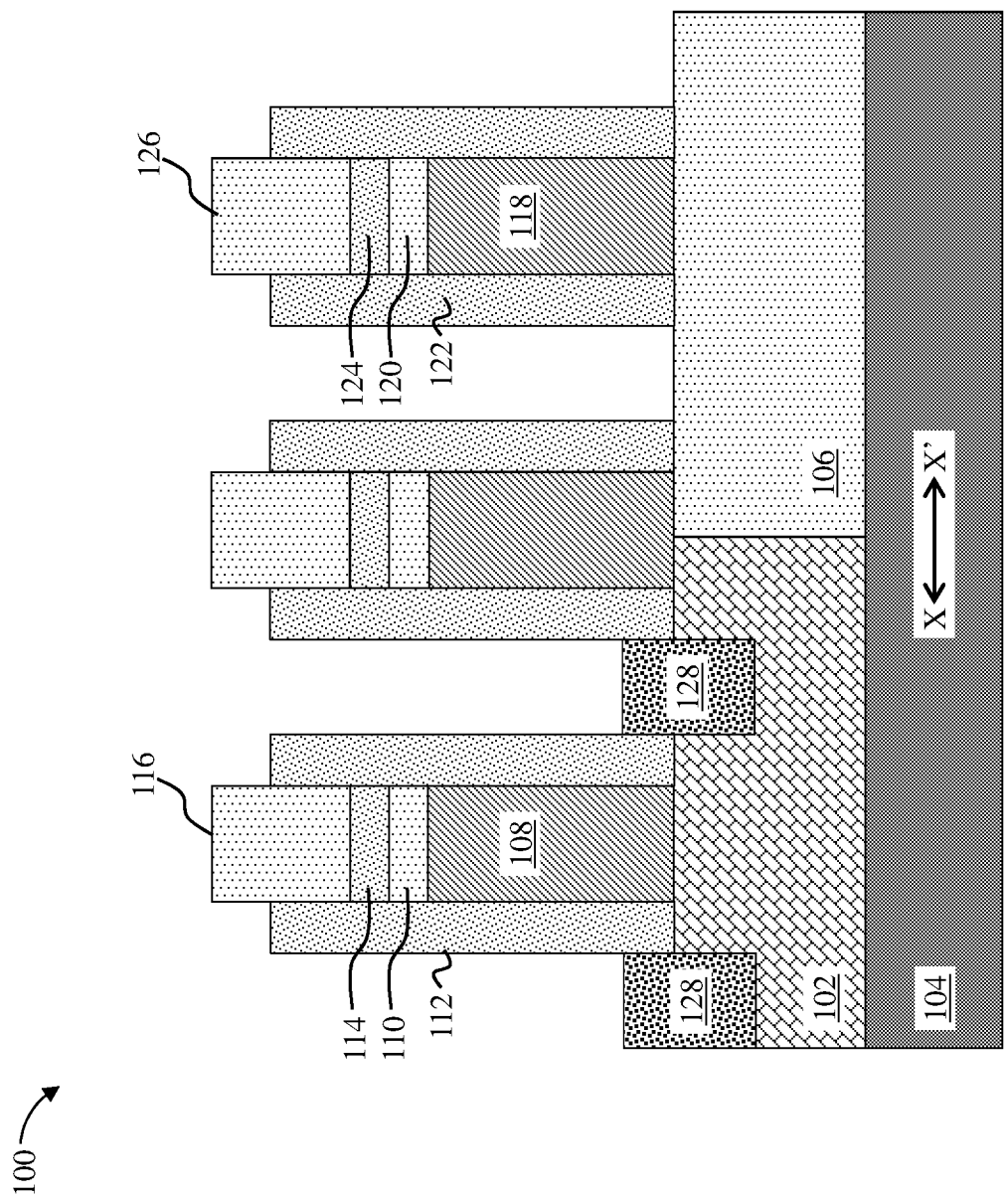
FIG. 1 depicts a cross-sectional view of a structure along a direction X-X' (parallel to fin direction) having a semiconductor fin formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" means that the thickness of, e.g., a conformal liner, is substantially the same on all surfaces, or that the thickness variation is less than 15% of the nominal thickness.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to aspects of the present invention, as previously noted herein, one technique for scaling semiconductor architectures is to employ non-planar device architectures such as a finFET. There are challenges, however, in scaling non-planar architectures beyond the 7 nm node. One challenge in further scaling finFETs is addressing the loss of ILD height during the conventional RMG process (e.g., hard mask open, poly gate pull, and epitaxy pre-clean). Some conventional finFET processes compensate for this expected loss of ILD height by employing taller sacrificial gates having higher aspect ratios. These high aspect ratio sacrificial gates, also known as dummy or poly gates, are difficult to cleanly remove during the sacrificial gate RIE, are susceptible to flop over, and complicate the downstream spacer and epitaxy processes.

Turning now to an overview of aspects of the present invention, one or more embodiments described herein provide methods of fabricating a semiconductor device that improve gate height control and ILD protection during the RMG process. Adjacent sacrificial gates, each having an oxide hard mask, are formed over channel regions of a semiconductor fin. The oxide hard masks serve as a hard stop during a subsequent nitride CMP, allowing for a well-controlled gate height. An ILD is formed over source/drain regions between the adjacent sacrificial gates. The ILD is recessed and an ILD hard mask is formed over the ILD. The ILD hard mask protects the ILD during critical downstream RMG processes (e.g., hard mask open, silicon etch, epitaxy pre-clean, and poly pull), preventing the conventional ILD height loss. Consequently, it is not necessary to oversize the sacrificial gates.

Example methods for improving gate height control and ILD protection during the RMG process and the resulting structures therefrom in accordance with embodiments of the present invention are described in detail below by referring to the accompanying drawings in FIGS. 1-12.

FIG. 1 illustrates a cross-sectional view of a structure 100 along a direction X-X' (parallel to fin direction) having a semiconductor fin 102 formed on a substrate 104 during an intermediate operation of a method of fabricating a finFET semiconductor device according to one or more embodiments of the present invention. The semiconductor fin 102 can be formed on the substrate 104 using known finFET fabrication techniques. For example, in some embodiments, a patterned hard mask (not depicted) is etched to expose portions of the semiconductor fin 102. The exposed portions of the semiconductor fin 102 can then be removed to form a plurality of semiconductor fins. The patterned hard mask is then removed using an etch process, which can be a wet etch process, a dry etch process or a combination thereof. In other embodiments the semiconductor fin 102 is epitaxially grown on the substrate 104. In other embodiments, the semiconductor fin 102 is formed on the substrate 104 using known planar device fabrication techniques. For ease of discussion reference is made to a finFET process. It is understood, however, that the below techniques (i.e., the use of a CMP stopping oxide to form gates having well-controlled heights) can be used in both nonplanar and planar device architectures.

The semiconductor fin 102 can be made of any suitable material, such as, for example, Si, SiGe, III-V compound semiconductor material, or other suitable materials. Group III-V compound semiconductor materials include materials having at least one group III element and at least one group V element, such as, for example, one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

The substrate 104 can be made of any suitable substrate material, such as, for example, monocrystalline Si, SiGe, SiC, III-V compound semiconductor, II-VI compound semiconductor, or semiconductor-on-insulator (SOI). In some embodiments, the substrate 104 includes a substrate buffer (not depicted). In some embodiments, the substrate 104 includes both an nFET Region and a pFET Region. In some embodiments, the substrate 104 includes either an nFET Region or a pFET Region. In embodiments where the semiconductor fin 102 is made of InGaAs, the substrate 104 can be InP.

In some embodiments, a semiconductor buffer layer (not depicted) can be formed between the semiconductor fin 102 and the substrate 104. The semiconductor buffer layer can be made of any suitable material, such as, for example, Si, SiGe, III-V compound semiconductor material, or other suitable materials. In embodiments where the semiconductor fin 102 is made of InGaAs and the substrate 104 is made of InP, the semiconductor buffer layer 106 can be made of indium aluminum arsenide (InAlAs).

In some embodiments, a shallow trench isolation (STI) region 106 is formed adjacent to the semiconductor fin 102 on a surface of the substrate 104. STI regions prevent electrical current leak between adjacent semiconductor device components. The STI region 106 can be of any suitable material, such as, for example, an oxide. In some embodiments, CMP is used to remove any excess portion of the STI region 106 (known as overburden) that extends above a top surface of the semiconductor fin 102.

A sacrificial gate 108 is formed over channel regions of the semiconductor fin 102. Any known method for patterning a sacrificial gate can be used, such as, for example, a dry etch, or a combination of sequential dry and wet etches. For example, in some embodiments, a layer of amorphous silicon (a-Si) is etched using a patterned hard mask (not depicted). In some embodiments, a thin oxide layer, such as silicon dioxide (SiO$_2$), is deposited between the a-Si layer and the semiconductor fin 102. In some embodiments, a CMP stopping oxide 110 (an oxide hard mask) is formed on the sacrificial gate 108. The CMP stopping oxide 110 can be made of any suitable material, such as, for example, SiO$_2$, silicon oxynitride (SiON), or silicon oxygen carbonitride (SiOCN). The CMP stopping oxide 110 serves as a hard stop during a subsequent nitride CMP, allowing for a well-controlled gate height.

In some embodiments, spacers 112 are formed on sidewalls of the sacrificial gate 108. In some embodiments, the spacers 112 are formed using a CVD, PECVD, ALD, PVD, chemical solution deposition, or other like process in combination with a wet or dry etch process. The spacers 112 can be made of any suitable material capable of being removed selective to the CMP stopping oxide 110, such as, for example, a nitride, silicon nitride (SiN), or silicoboron carbonitride (SiBCN). In some embodiments, a second hard mask 114 is formed over the CMP stopping oxide 110. The second hard mask 114 can be made of the same material as the spacers 112 or of any suitable material capable of being removed selective to the CMP stopping oxide 110, such as, for example, a nitride, SiN, or SiBCN.

In some embodiments, an oxide layer 116 is formed on a surface of the second hard mask 114. The oxide layer 116 can be made of a similar material as the CMP stopping oxide 110, such as, for example, SiO$_2$, SiON, or SiOCN. The oxide layer 116 prevents excess damage to the second hard mask 114 during the spacers 112 etch process. In some embodiments, portions of the spacers 112 extend along sidewalls of the CMP stopping oxide 110, the second hard mask 114, and the oxide layer 116.

A plurality of sacrificial gates, each having an oxide hard mask, spacers, a second hard mask, and an oxide layer, can be formed adjacent to the sacrificial gate 108 on the semiconductor fin 102 and the STI region 106. For ease of discussion, additional reference is made only to a sacrificial gate 118 formed over a surface of the STI region 106. In a similar manner to the sacrificial gate 108, the sacrificial gate 118 includes a CMP stopping oxide 120, spacers 122, a second hard mask 124, and an oxide layer 126.

In some embodiments, doped regions 128 are formed on the semiconductor fin 102 on opposite ends of the sacrificial gate 108. The doped regions 128 can be source or drain regions formed by a variety of methods, such as, for example, in-situ doped epitaxy, doped following the epitaxy, or by implantation and plasma doping. In some embodiments, the doped regions 128 are complementary, such that one of the doped regions is a source while the other is a drain. The doped regions 128 can be formed by any suitable process, including but not limited to, ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, the doped regions 128 include epitaxial semiconductor materials grown from gaseous or liquid precursors. In some embodiments, epitaxial regions are epitaxially grown over the semiconductor fin 102 and/or substrate 104. Epitaxial semiconductor materials can be grown using vapor-phase epitaxy (VPE), MBE, liquid-phase epitaxy (LPE), or other suitable processes. The doped regions 128 can be doped during deposition (in-situ doped) by adding dopants, n-type dopants (e.g., phosphorus or arsenic) or p-type dopants (e.g., Ga, B, BF$_2$, or Al). The dopant concentration in the doped regions 128 can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$.

The doped regions 128 can be made of any suitable material, such as, for example, Si, SiGe, III-V compound semiconductor, or other suitable materials. In some embodiments, the doped regions 128 are raised source/drain regions formed from III-V compound semiconductor material. In some embodiments, the gas source for the deposition of epitaxial semiconductor material includes a silicon, a germanium, or a III-V compound semiconductor containing gas source, or a combination thereof. For example, an epitaxial InGaAs layer can be deposited from a gas source that is selected from the group consisting of arsine, trimethyl indium, and trimethyl gallium. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions 128 include silicon. In some embodiments, the doped regions 128 include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Figure 2:
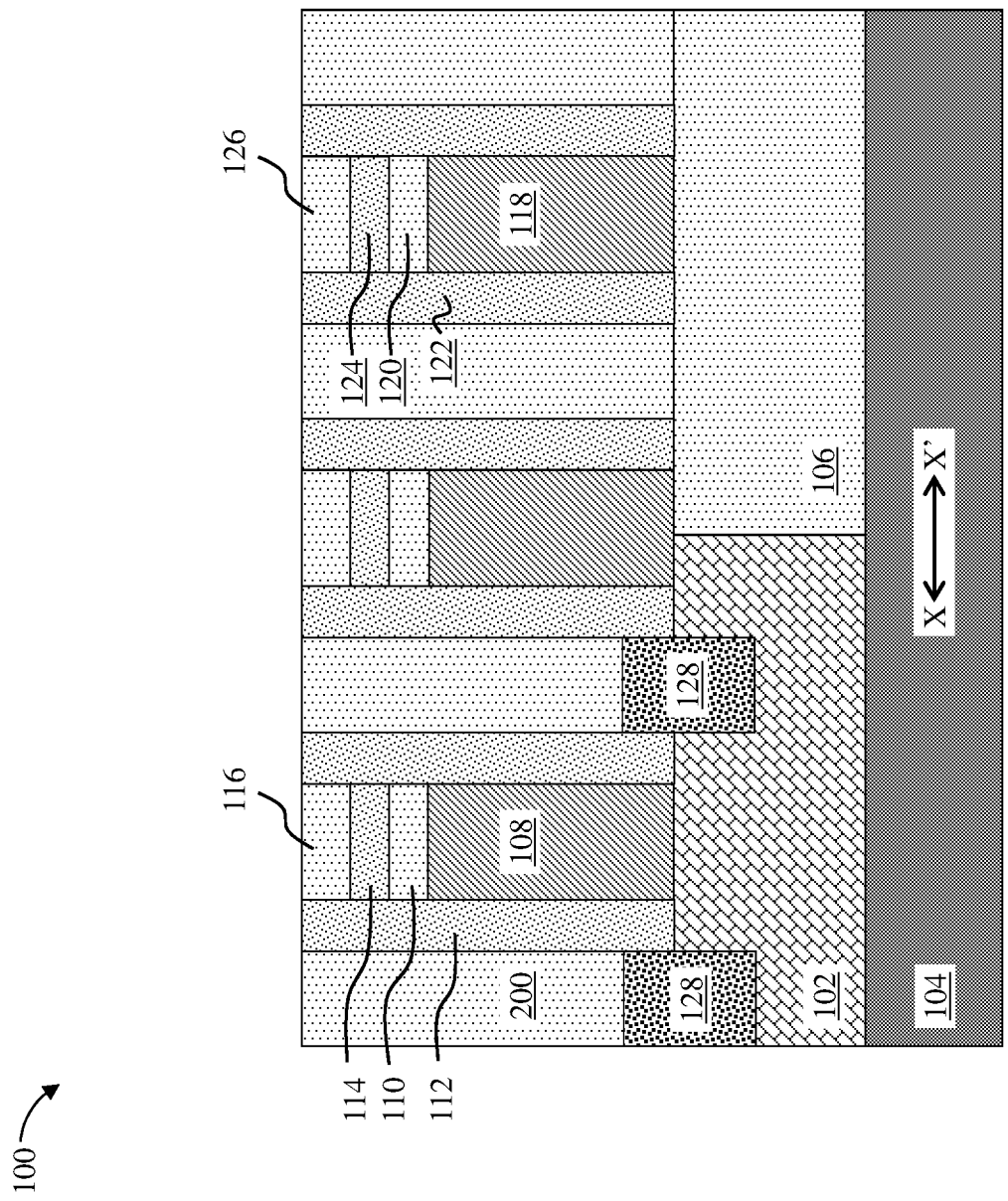
FIG. 2 depicts a cross-sectional view of the structure after forming an ILD layer between adjacent sacrificial gates and over the semiconductor fin and STI region during an intermediate operation of a method of fabricating a semiconductor device according to one or more embodiments of the present invention.

FIG. 2 illustrates a cross-sectional view of the structure 100 after forming an interlayer dielectric (ILD) layer 200 between adjacent sacrificial gates and over the semiconductor fin 102 and STI region 106 during an intermediate operation of a method of fabricating a semiconductor device according to one or more embodiments of the present invention. The ILD 200 can be made of any suitable dielectric material, such as, for example, porous silicates, carbon doped oxides, silicon dioxide, silicon nitrides, silicon oxynitrides, or other dielectric materials. Any known manner of forming the ILD 200 can be utilized. The ILD 200 can be formed using, for example, CVD, PECVD, ALD, flowable CVD (flowable oxide), spin-on dielectrics, or PVD.

Portions of the ILD 200 are formed on the doped regions 128 adjacent to the sacrificial gate 108. To improve gap filling, the quality of the ILD 200 is usually poor and the wet etch rate is high. Moreover, due to the incoming gate height variations after spacer/epi modules, the gate height can be very non-uniform. Consequently, in some embodiments, the ILD 200, spacers 112 and 122, and oxide layers 116 and 126 are planarized to a same height using, for example, CMP.

Figure 3:
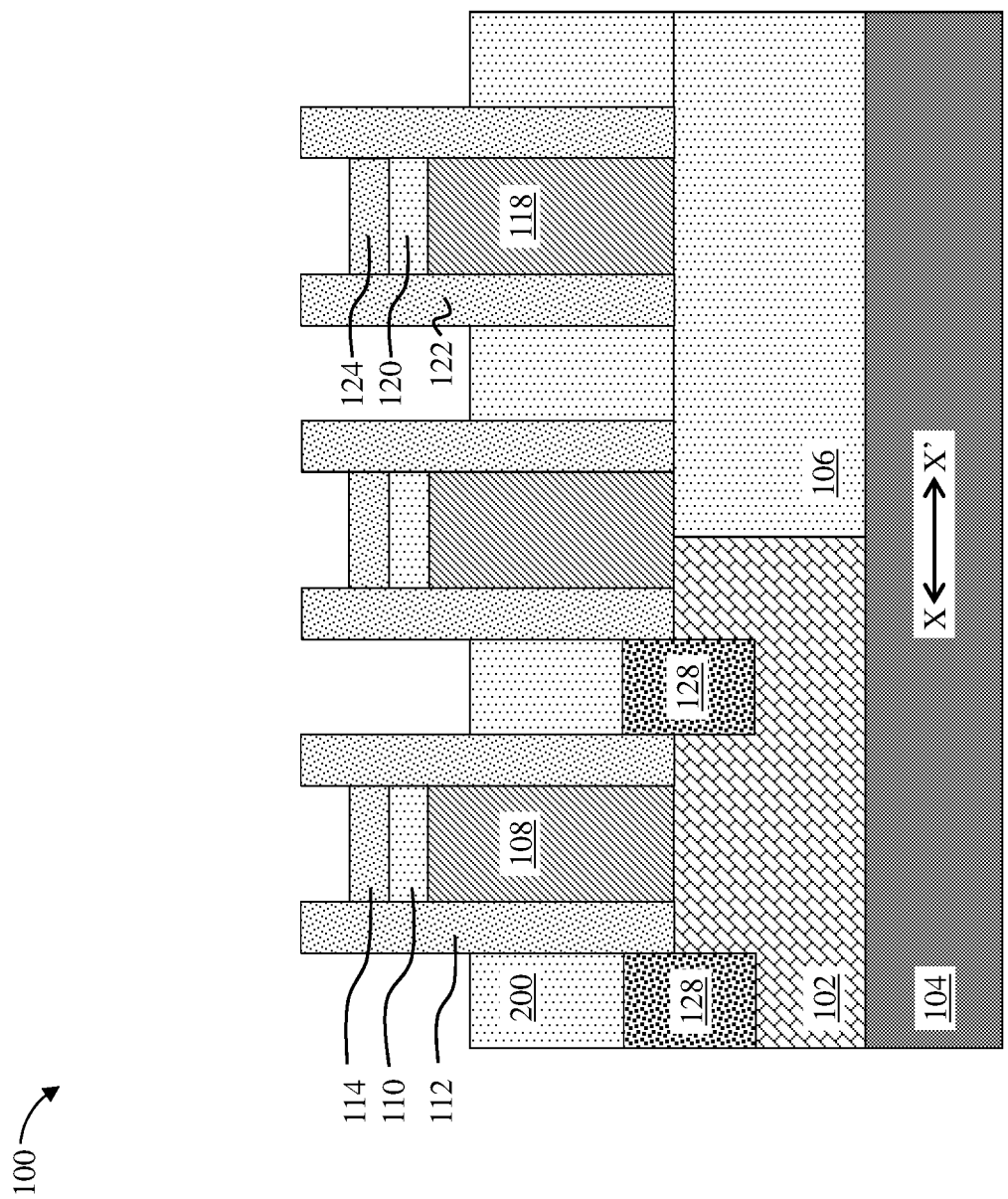
FIG. 3 depicts a cross-sectional view of the structure after recessing the ILD during an intermediate operation of a method of fabricating a semiconductor device according to one or more embodiments of the present invention.

FIG. 3 illustrates a cross-sectional view of the structure 100 after recessing the ILD 200 during an intermediate operation of a method of fabricating a semiconductor device according to one or more embodiments of the present invention. The ILD 200 can be recessed using any suitable techniques, such as, for example, an oxide recess. In some embodiments, the oxide recess also results in the removal of the oxide layers (e.g., oxide layers 116 and 126). Recessing the ILD 200 forms a cavity between adjacent pairs of sacrificial gates. In some embodiments, the target position of the surface of the ILD 200 after recessing is at least 10 nm below the top surface of the CMP stopping oxide 110.

Figure 4:
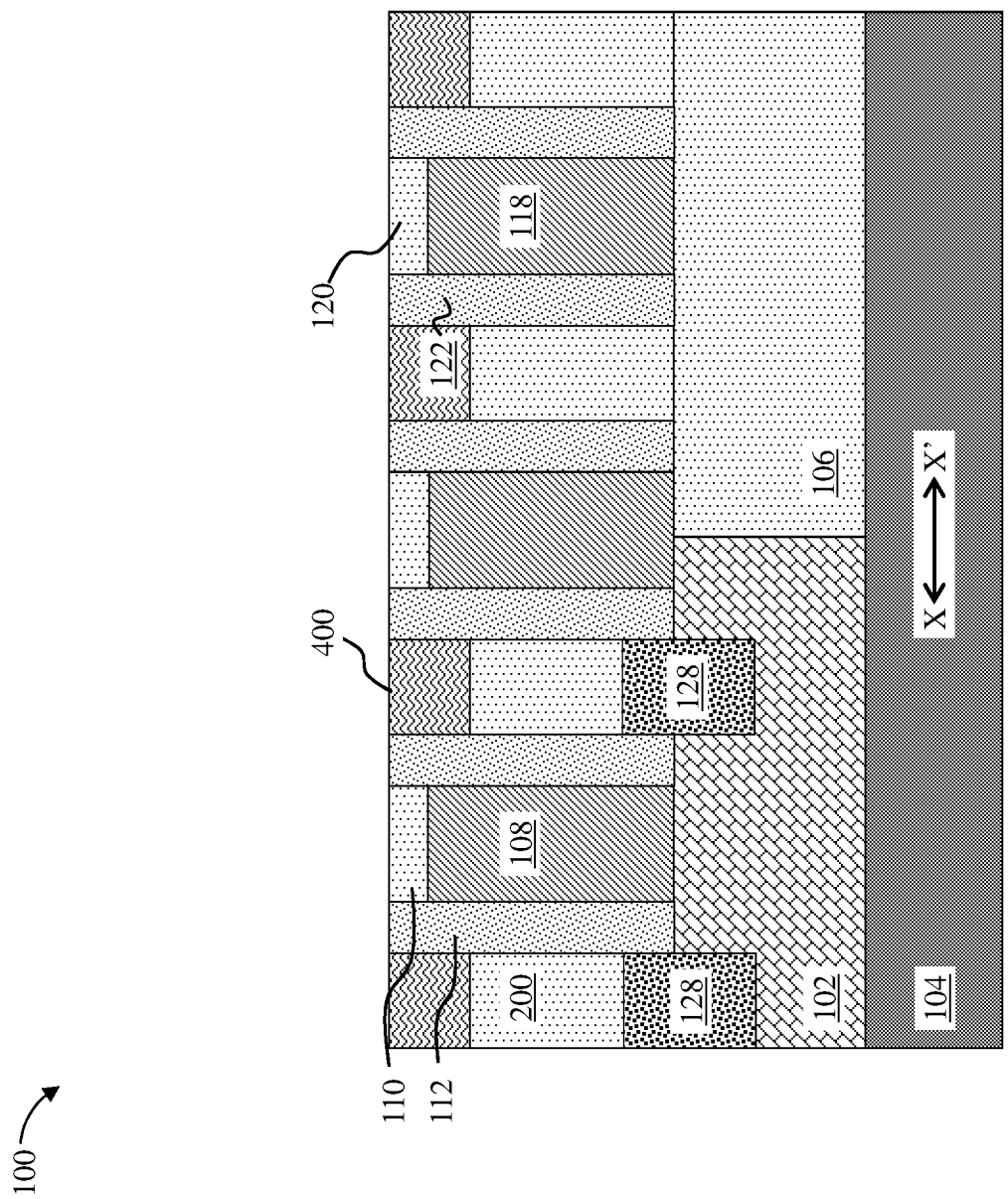
FIG. 4 depicts a cross-sectional view of the structure after forming a nitride layer on the ILD and planarizing to a surface of oxide hard masks during an intermediate operation of a method of fabricating a semiconductor device according to one or more embodiments of the present invention.

FIG. 4 illustrates a cross-sectional view of the structure 100 after forming a nitride layer 400 on the ILD 200 and planarizing to a surface of the CMP stopping oxides 110 and 120 during an intermediate operation of a method of fabricating a semiconductor device according to one or more embodiments of the present invention. In some embodiments, the nitride layer 400 is formed using a CVD, PECVD, ALD, PVD, chemical solution deposition, or other like process. The nitride layer 400 can be made of any suitable material capable of being removed selective to the CMP stopping oxide 110, such as, for example, a nitride, SiN, or SiBCN. In some embodiments, the nitride layer 400 overfills the cavity formed when recessing the ILD 200.

Following the ILD 200 recess and nitride layer 400 deposition, the remaining surface materials of the structure 100 (i.e., the spacers 112, second hard mask 114, and nitride layer 400) are nitrides and the structure 100 can be planarized to a surface of the CMP stopping oxides 110 and 120 using, for example, CMP. During the CMP, the spacers 112 and 122 and the second hard masks 114 and 124 are removed selective to the CMP stopping oxides 110 and 120. In this manner, the CMP stopping oxides 110 and 120 serve as a hard stop. In some embodiments, the CMP includes cobalt slurry, which advantageously allows for a nitride CMP hard stop on $SiO_2$ without any dishing.

Figure 5:
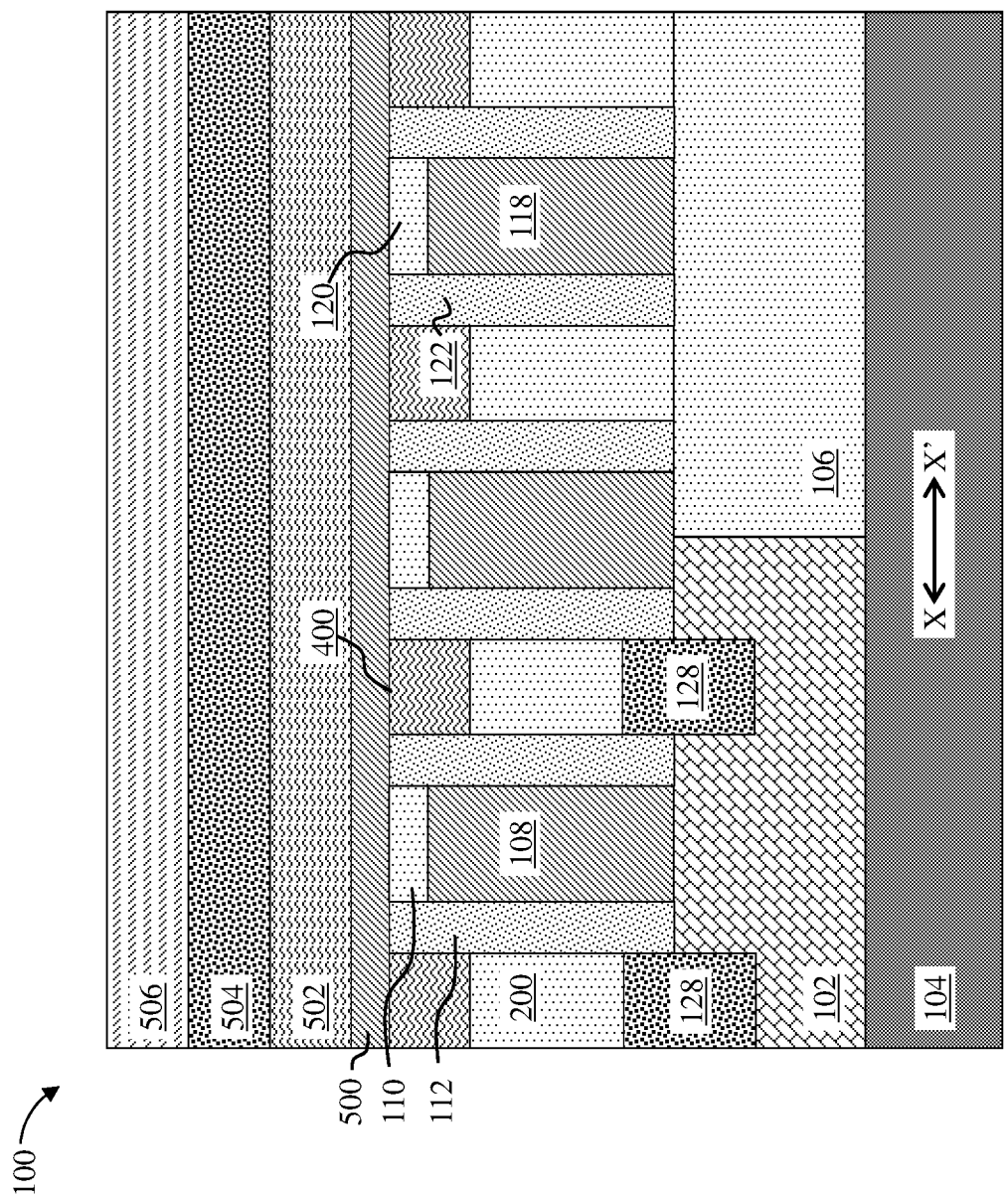
FIG. 5 depicts a cross-sectional view of the structure after forming a photoresist layer, an organic planarization layer (OPL) layer, and a low temperature oxide (LTO) layer over the nitride layer, the oxide hard masks, and spacers during an intermediate operation of a method of fabricating a semiconductor device according to one or more embodiments of the present invention.

FIG. 5 illustrates a cross-sectional view of the structure 100 after forming a multi-layered mask over the nitride layer 400, the CMP stopping oxides 110 and 120, and the spacers 112 and 122 during an intermediate operation of a method of fabricating a semiconductor device according to one or more embodiments of the present invention. The multi-layered mask includes a hard mask layer 500, an organic planarization layer (OPL) 502, an antireflective coating (ARC) layer 504, and a photoresist layer 506. The material for the hard mask layer 500 is selected such that the hard mask layer 500 has etch selectivity to both the CMP stopping oxides 110 and 120 and the nitride layer 400 (e.g., the hard mask layer 500 will etch at a different rate, or not at all, when exposed to the same etchant used to remove or etch either the CMP stopping oxides 110 and 120 or the nitride layer 400). In some embodiments, the hard mask layer 500 is an amorphous silicon layer. The ARC layer 504 can be made of any suitable material, such as, for example, a low temperature oxide (LTO), SiARC, TiARC, or SiON.

Figure 6:
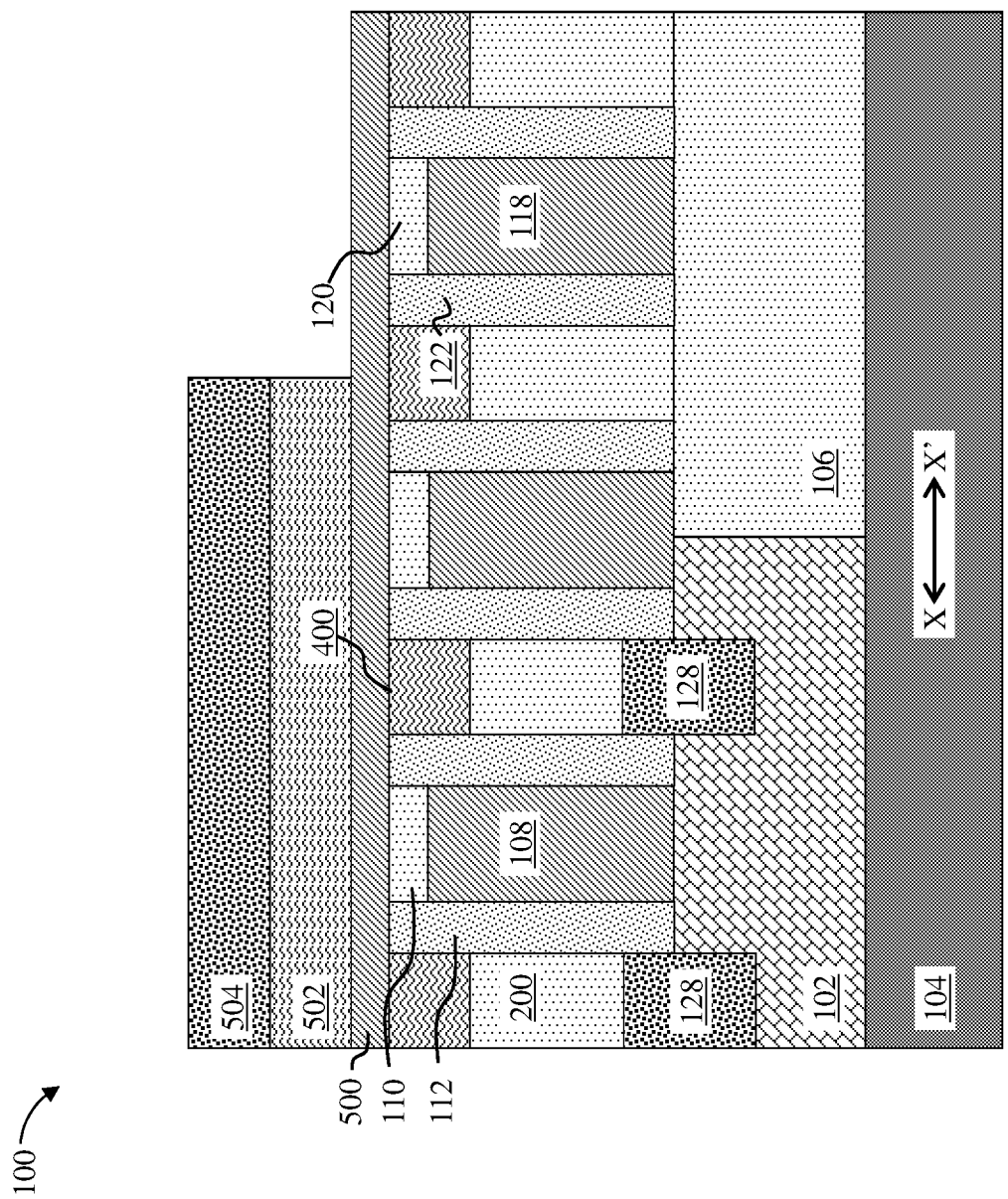
FIG. 6 depicts a cross-sectional view of the structure after patterning the photoresist layer and removing portions of the OPL layer and LTO layer to expose a surface of the hard mask layer over the STI region during an intermediate operation of a method of fabricating a semiconductor device according to one or more embodiments of the present invention.

FIG. 6 illustrates a cross-sectional view of the structure 100 after patterning the photoresist layer 506 and removing portions of the OPL layer 502 and ARC layer 504 to expose a surface of the hard mask layer 500 over the STI region 106 during an intermediate operation of a method of fabricating a semiconductor device according to one or more embodiments of the present invention. In some embodiments, a selective etching step or steps is performed to pattern the ARC layer 504 and the OPL layer 502 in sequence using the PR layer 506 as an etch mask. The PR layer 506 (and the antireflective coating, if present) is then removed.

Figure 7:
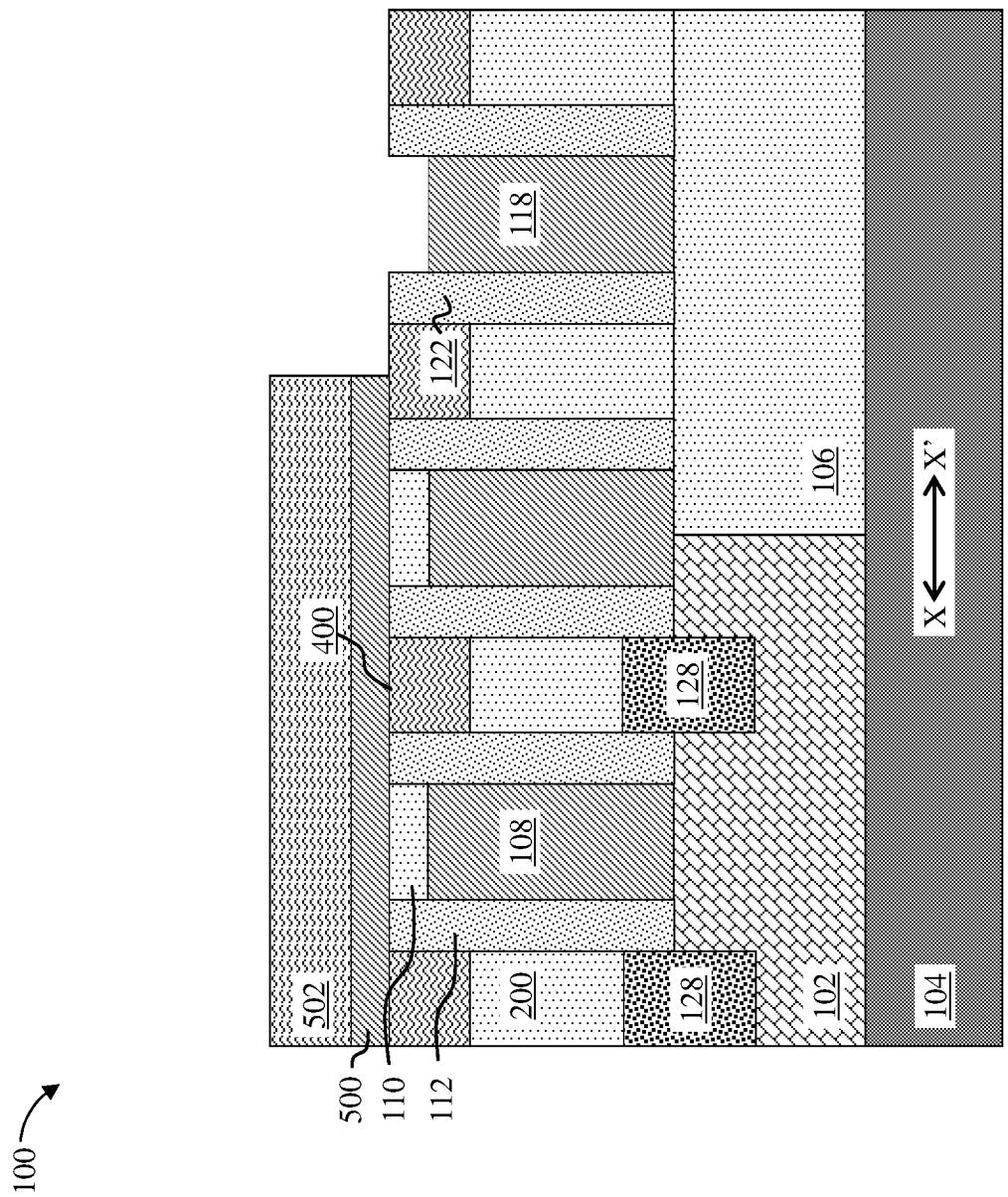
FIG. 7 depicts a cross-sectional view of the structure after removing the LTO layer, portions of the hard mask layer, and the oxide hard mask during an intermediate operation of a method of fabricating a semiconductor device according to one or more embodiments of the present invention.

FIG. 7 illustrates a cross-sectional view of the structure 100 after removing the ARC layer 504, portions of the hard mask layer 500, and the CMP stopping oxide 120 during an intermediate operation of a method of fabricating a semiconductor device according to one or more embodiments of the present invention. Any known method for removing the ARC layer 504 can be used, such as, for example, a wet etch or a dry etch. In some embodiments, the ARC layer 504 is removed selective to the hard mask layer 500 and the hard mask layer 500 is patterned selective to the CMP stopping oxide 120 and nitride layer 400.

Exposed portions of the hard mask layer 500 (i.e., those portions that are not covered by the patterned OPL layer 502) are then removed using, for example, RIE selective to the nitride layer 400 and/or the spacers 122. Removing these portions of the hard mask layer 500 exposes the CMP stopping oxide 120. The CMP stopping oxide 120 is then removed to expose a surface of the sacrificial gate 118 using, for example, a wet or dry etch. The ILD 200 is protected during the patterning of the hard mask layer 500 and the removal of the CMP stopping oxide 120 by the nitride layer 400, preserving the ILD 200 and preventing an ILD height loss.

Figure 8:
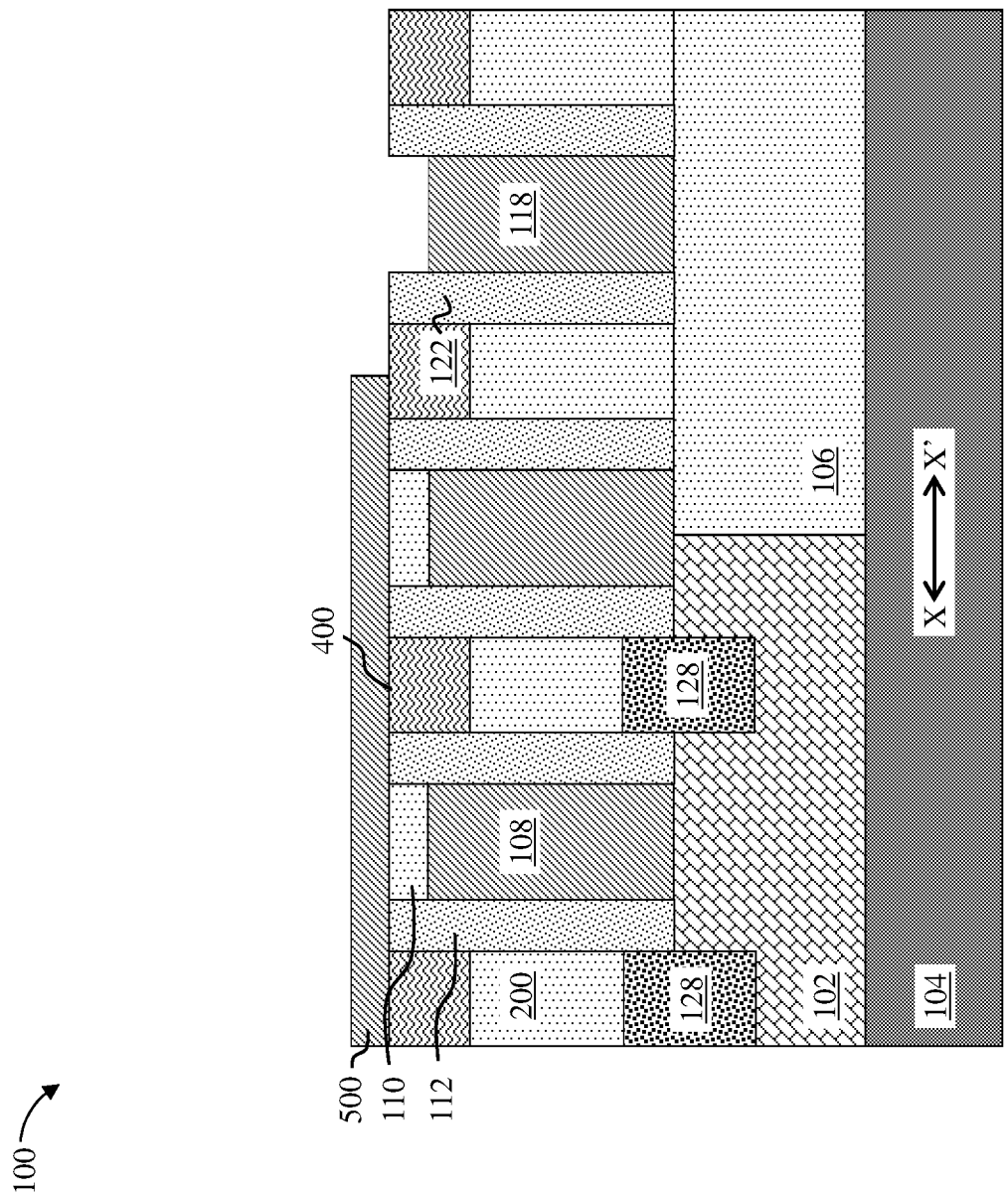
FIG. 8 depicts a cross-sectional view of the structure after removing the OPL layer during an intermediate operation of a method of fabricating a semiconductor device according to one or more embodiments of the present invention.

FIG. 8 illustrates a cross-sectional view of the structure 100 after removing the OPL layer 502 during an intermediate operation of a method of fabricating a semiconductor device according to one or more embodiments of the present invention. Any known method for removing the OPL layer 502 can be used, such as, for example, a wet etch, a dry etch, or an ashing process.

Figure 9:
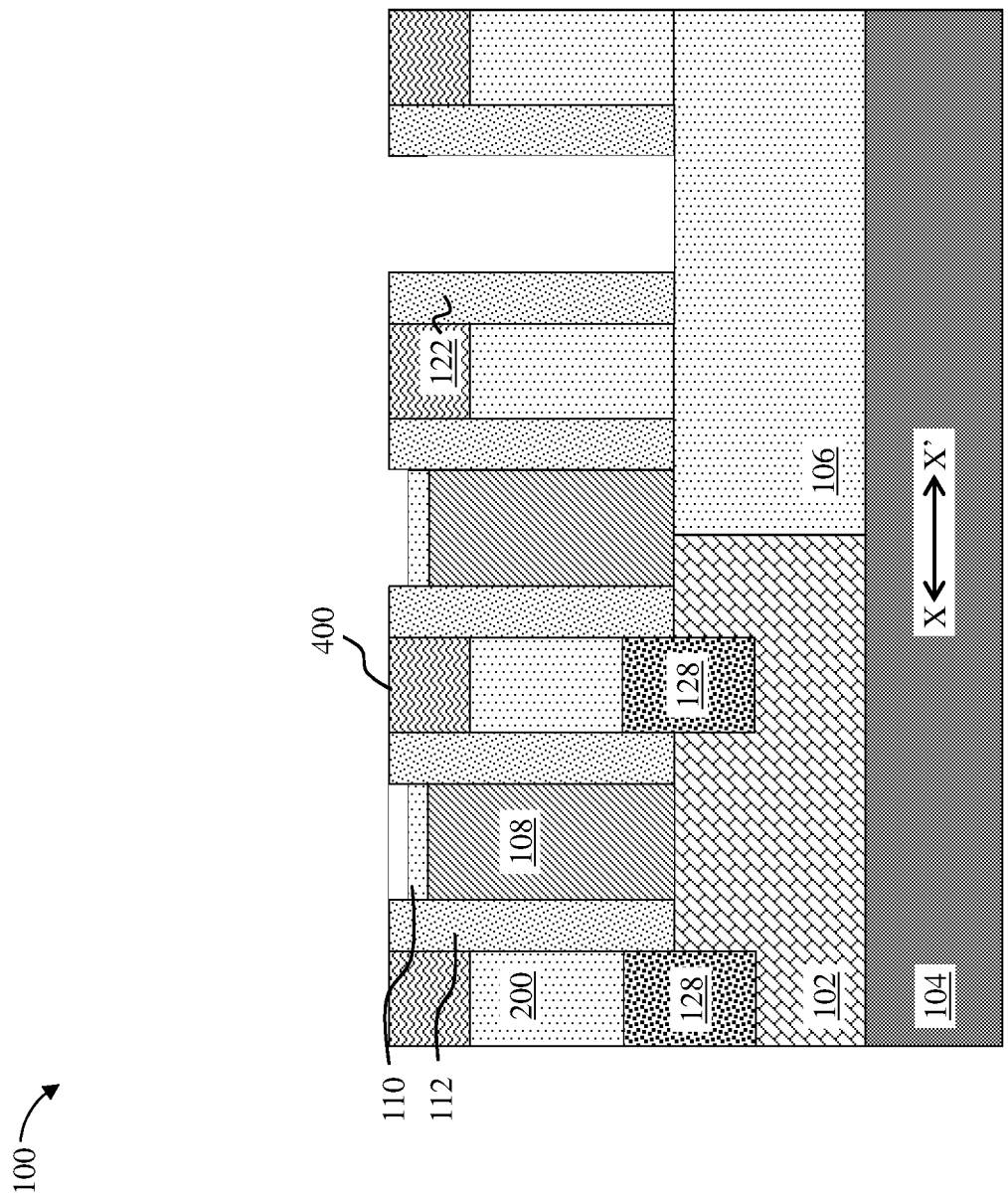
FIG. 9 depicts a cross-sectional view of the structure after removing the remaining portions of the hard mask layer and the exposed sacrificial gates during an intermediate operation of a method of fabricating a semiconductor device according to one or more embodiments of the present invention.

FIG. 9 illustrates a cross-sectional view of the structure 100 after removing the remaining portions of the hard mask layer 500 and the exposed sacrificial gates (e.g., sacrificial gate 118) during an intermediate operation of a method of fabricating a semiconductor device according to one or more embodiments of the present invention. In some embodiments, a dilute hydrofluoric acid (DHF) clean then removes any native oxides and any trapped inorganic contaminants from exposed surfaces of the structure 100. In some embodiments, the removal process and/or DHF clean damages (i.e., reduces the height of) the CMP stopping oxide 110. The ILD 200 is protected during the removal process and DHF clean by the nitride layer 400.

Figure 10:
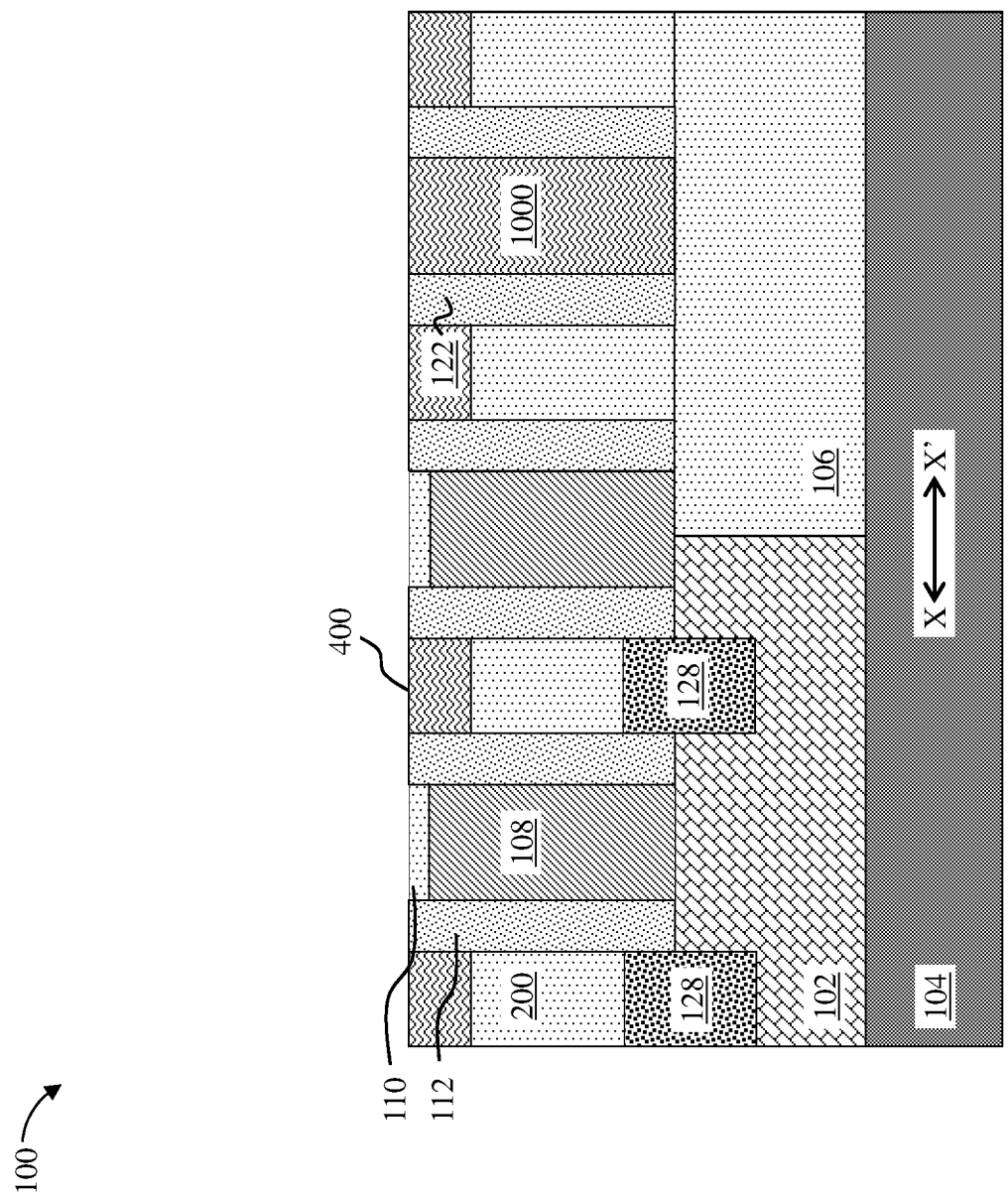
FIG. 10 depicts a cross-sectional view of the structure after replacing the removed sacrificial gates with a nitride layer and planarizing to a surface of the oxide hard mask during an intermediate operation of a method of fabricating a semiconductor device according to one or more embodiments of the present invention.

FIG. 10 illustrates a cross-sectional view of the structure 100 after replacing the removed sacrificial gates (e.g., sacrificial gate 118) with a nitride layer 1000 and planarizing to a surface of the CMP stopping oxide 110 during an intermediate operation of a method of fabricating a semiconductor device according to one or more embodiments of the present invention. In some embodiments, the nitride layer 1000 is formed using a CVD, PECVD, ALD, PVD, chemical solution deposition, or other like process. The nitride layer 1000 can be made of any suitable material, such as, for example, a nitride, silicon nitride, SiON, SiOCN, or SiBCN. The structure 100 can be planarized to a surface of the CMP stopping oxide 110 using, for example, a CMP selective to the CMP stopping oxide 110. In some embodiments, the CMP includes a cobalt slurry, which advantageously allows for a nitride CMP hard stop on the CMP stopping oxide 110

(e.g., SiO$_2$) without any dishing. In this manner, the CMP stopping oxide 110 serves as a CMP hard stop, allowing for a well-controlled gate height.

Figure 11:
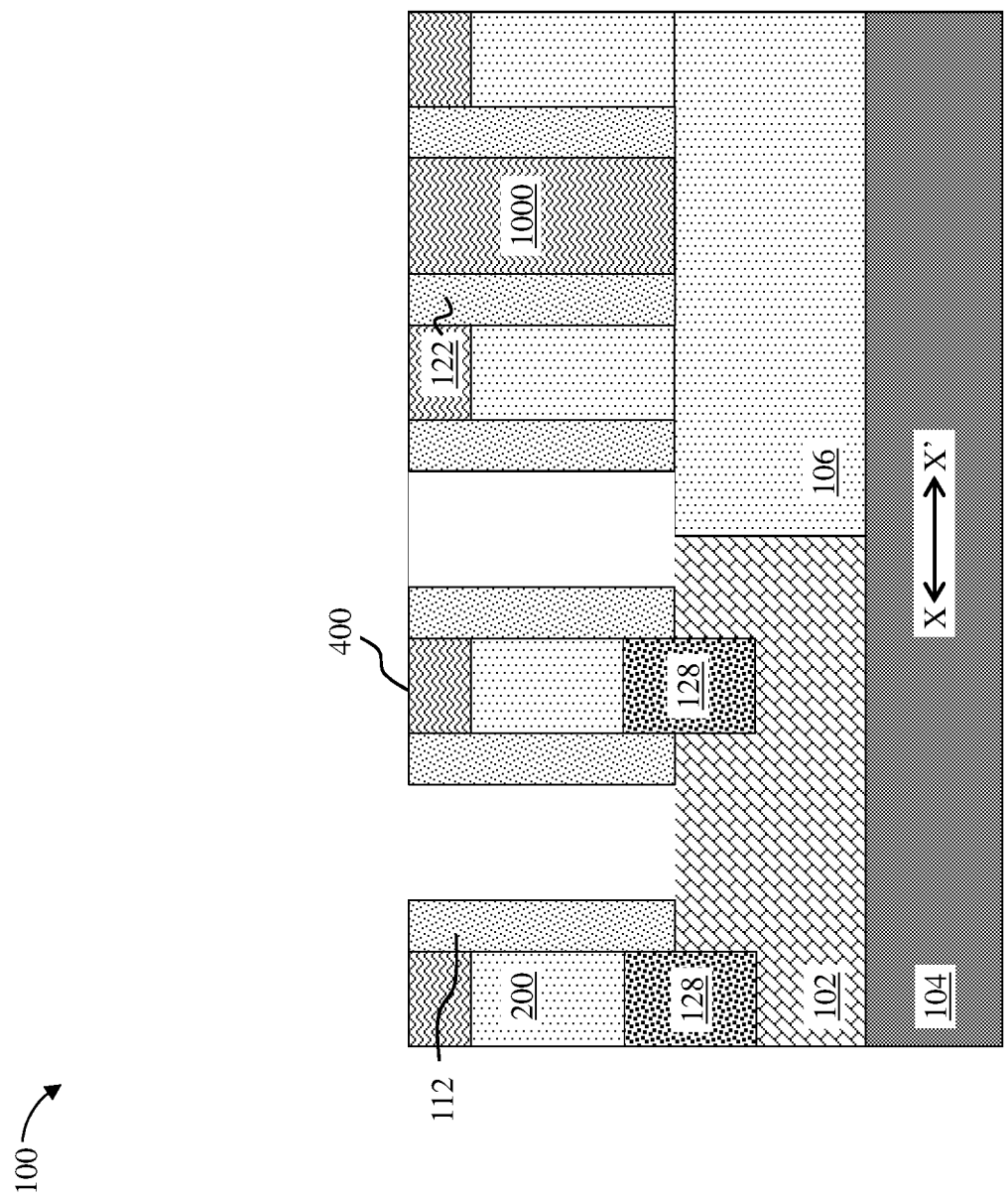
FIG. 11 depicts a cross-sectional view of the structure after removing the oxide hard mask and the remaining sacrificial gates during an intermediate operation of a method of fabricating a semiconductor device according to one or more embodiments of the present invention.

FIG. 11 illustrates a cross-sectional view of the structure 100 after removing the CMP stopping oxide 110 and the sacrificial gate 108 during an intermediate operation of a method of fabricating a semiconductor device according to one or more embodiments of the present invention. The CMP stopping oxide 110 and the sacrificial gate 108 can be removed using known RMG processes, such as, for example, a wet etch process, a dry etch process, a series of sequential wet or dry etches, or a combination thereof.

Figure 12:
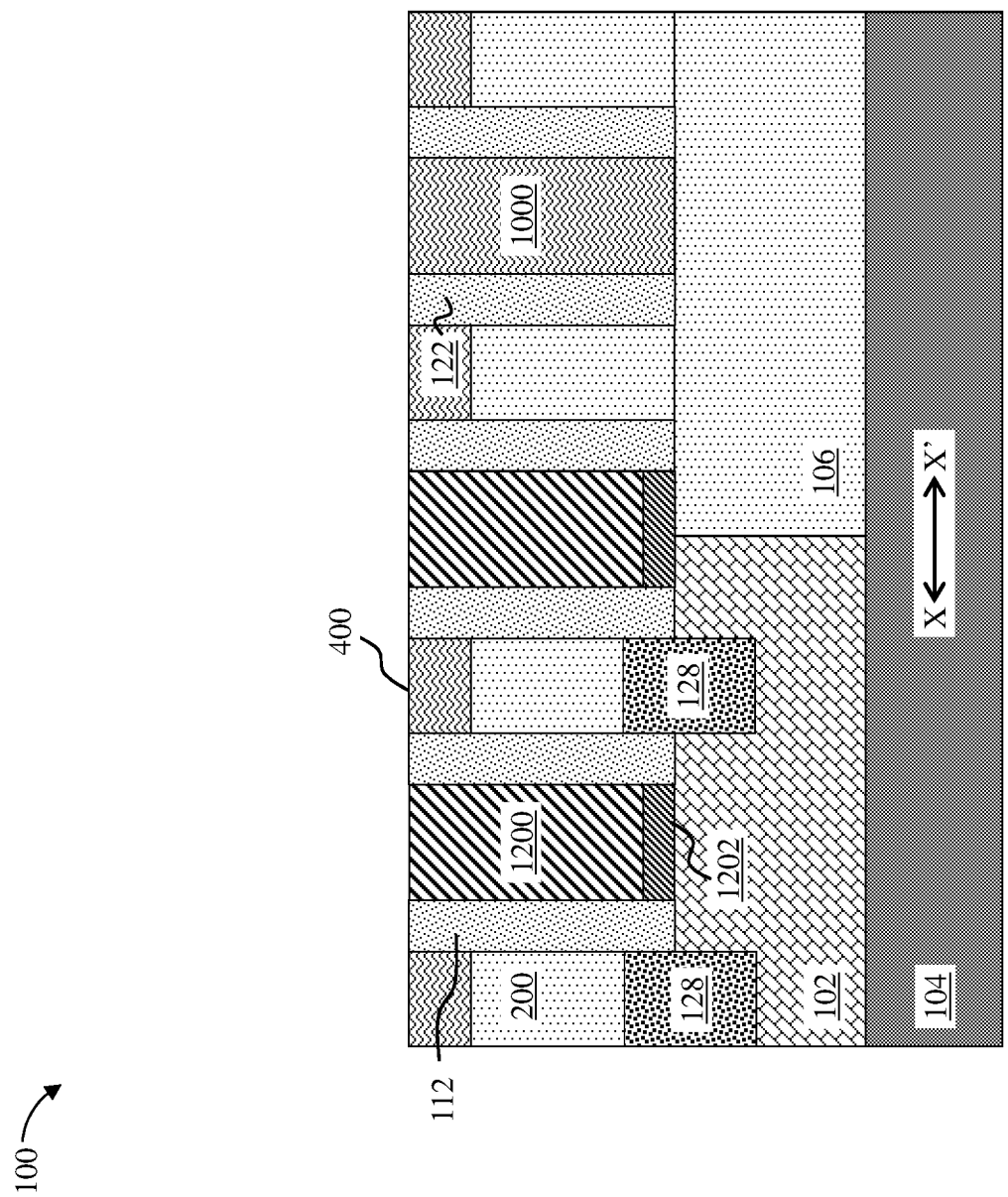
FIG. 12 depicts a cross-sectional view of the structure after replacing the sacrificial gate with a conductive gate during an intermediate operation of a method of fabricating a semiconductor device according to one or more embodiments of the present invention.

FIG. 12 illustrates a cross-sectional view of the structure 100 after replacing the sacrificial gate 108 with a conductive gate 1200 during an intermediate operation of a method of fabricating a semiconductor device according to one or more embodiments of the present invention. The conductive gate 1200 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials.

In some embodiments, a high-k dielectric 1202 is formed between the conductive gate 1200 and the semiconductor fin 102 (i.e., over the channel region of the semiconductor fin 102). In some embodiments, the high-k dielectric 1202 modifies the work function of the gate. The high-k dielectric 1202 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric 1202 can have a thickness of about 0.5 nm to about 4 nm, or about 2 nm to about 3 nm, although other thicknesses are within the contemplated scope of the invention.

In some embodiments, work function layers (not depicted) are formed between the high-k dielectric 1202 and the conductive gate 1200. The work function layers can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, the work function layers further modify the work function of the gate.

Conductive contacts (gate contacts and source/drain contacts, not depicted) can be formed or deposited using known finFET metallization techniques. In some embodiments, an ILD is patterned with open trenches and the contacts are deposited into the trenches. In some embodiments, the contacts are overfilled into the trenches, forming overburdens above a surface of the ILD. In some embodiments, a CMP selective to the ILD removes the overburden. The contacts can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming an oxide hard mask on a surface of a sacrificial gate;
    forming an interlayer dielectric (ILD) adjacent to the sacrificial gate such that a top surface of the ILD is below a surface of the oxide hard mask; and
    forming a nitride layer on and in direct contact with the top surface of the ILD.

2. The method of claim 1, wherein a bottom surface of the nitride layer is below a bottom surface of the oxide hard mask.

3. The method of claim 1, wherein the oxide hard mask comprises silicon dioxide (SiO$_2$) and the nitride layer comprises silicon nitride (SiN).

4. The method of claim 1, wherein forming the ILD comprises recessing the top surface of the ILD.

5. The method of claim 1 further comprising forming doped regions adjacent to a sidewall of the sacrificial gate.

6. The method of claim 5, wherein the ILD is formed on surfaces of the doped regions.

7. The method of claim 1 further comprising:
    forming a semiconductor fin on a substrate such that the sacrificial gate is formed over a channel region of the semiconductor fin;
    forming a shallow trench isolation (STI) region on the substrate and adjacent to the semiconductor fin;
    forming a second sacrificial gate over the STI region; and
    replacing the second sacrificial gate over the STI region with a nitride layer.

8. A method for forming a semiconductor device, the method comprising:
    forming a first plurality of sacrificial gates over channel regions of a semiconductor fin and a second plurality of sacrificial gates over a shallow trench isolation (STI) region;

forming an oxide hard mask on a surface of each of the sacrificial gates;

forming an interlayer dielectric (ILD) between each pair of adjacent sacrificial gates such that a top surface of the ILD is below a surface of each of the oxide hard masks; and forming a nitride layer on and in direct contact with the top surface of the ILD.

9. The method of claim 8, wherein each oxide hard mask comprises silicon dioxide ($SiO_2$) and the nitride layer comprises silicon nitride (SiN).

10. The method of claim 8, further comprising:

recessing a surface of the nitride layer such that the nitride layer is coplanar to the surface of each of the oxide hard masks;

removing the oxide hard masks and the first plurality of sacrificial gates to expose channel regions of the semiconductor fin; and forming a conductive gate over each of the exposed channel regions of the semiconductor fin.

11. The method of claim 10, wherein recessing the surface of the nitride layer comprises application of a cobalt slurry.

12. The method of claim 8 further comprising forming doped regions on the semiconductor fin, wherein each doped region is adjacent to a sidewall of a sacrificial gate of the first plurality of adjacent sacrificial gates.

13. The method of claim 12, wherein the ILD is formed on surfaces of the doped regions.

14. The method of claim 8 further comprising replacing the second plurality of adjacent sacrificial gates with a dielectric layer.

15. A semiconductor device comprising:

a spacer formed on a semiconductor fin and adjacent to a first sidewall of a gate;

an interlayer dielectric (ILD) formed adjacent to the first spacer, the ILD recessed below a surface of the gate; and a nitride layer formed on and in direct contact with a surface of the recessed ILD.

16. The semiconductor device of claim 15, wherein the nitride layer comprises silicon nitride (SiN).

17. The semiconductor device of claim 15, further comprising a doped region formed on a surface of the semiconductor fin and adjacent to a sidewall of the spacer.

18. The semiconductor device of claim 17, wherein the ILD is formed on a surface of the doped region.

19. The semiconductor device of claim 15, further comprising:

a shallow trench isolation (STI) region formed adjacent to the semiconductor fin; and a nitride layer formed on the STI region and between portions of the ILD.

20. The semiconductor device of claim 19, wherein a height of the nitride layer formed on the STI region is substantially equal to a height of the gate.

* * * * *